US012772391B2

(12) United States Patent
Dong et al.

(10) Patent No.: US 12,772,391 B2
(45) Date of Patent: Oct. 20, 2026

(54) INSULATION STRUCTURE AND ELECTRONIC DEVICE

(71) Applicant: Delta Electronics (Shanghai) Co., Ltd., Shanghai (CN)

(72) Inventors: Jianxing Dong, Shanghai (CN); Lei Chen, Shanghai (CN); Teng Liu, Shanghai (CN); Xiaohu Li, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 261 days.

(21) Appl. No.: 18/625,247

(22) Filed: Apr. 3, 2024

(65) Prior Publication Data

US 2025/0048567 A1 Feb. 6, 2025

(30) Foreign Application Priority Data

Aug. 4, 2023 (CN) ......................... 202310982995.5

(51) Int. Cl.
*H05K 5/02* (2006.01)
*H05K 3/10* (2006.01)
*H05K 9/00* (2006.01)

(52) U.S. Cl.
CPC ........... *H05K 5/0209* (2022.08); *H05K 3/107* (2013.01); *H05K 9/0007* (2013.01); *H05K 2201/09036* (2013.01)

(58) Field of Classification Search
CPC .......... H05K 2201/09036; H05K 2201/09072; H05K 1/0265
See application file for complete search history.

(56) References Cited

U.S. PATENT DOCUMENTS 6,600,395 B1 * 7/2003 Handforth ............... H01P 3/088 333/4
2021/0376074 A1 12/2021 Tanaka et al.
(Continued)

FOREIGN PATENT DOCUMENTS

CN 101345283 A * 1/2009 ......... H10H 20/8506
CN 110268518 A 9/2019
(Continued)

OTHER PUBLICATIONS

CN 101345283 A Translation (Year: 2026).*
The first Office Action of corresponding Taiwan application No. 112136071, dated Jun. 28, 2024.

*Primary Examiner* — Timothy J Thompson
*Assistant Examiner* — John B Freal
(74) *Attorney, Agent, or Firm* — CKC & Partners Co., LLC

(57) ABSTRACT

The present application provides an insulation structure and an electronic device, where the insulation structure includes a first substrate, a first conductive body, and a first groove, the first substrate includes a first surface and a second surface oppositely disposed; the first conductive body is disposed on the first surface or second surface; the first groove is located on a same surface as the first conductive body and adjacent to the first conductive body; a surface of the first groove is provided with a first conductive layer, and the first conductive layer is electrically connected with the first conductive body. The insulation structure of the present application slows down the trend of potential line changes at the end of the first conductive body, reduces the electric field strength here, and improves the reliability of insulation.

23 Claims, 8 Drawing Sheets

(56) References Cited

U.S. PATENT DOCUMENTS

| | | | |
|---|---|---|---|
| 2022/0013574 | A1 | 1/2022 | Moussy et al. |
| 2023/0057915 | A1 | 2/2023 | Yamaguchi |

FOREIGN PATENT DOCUMENTS

| | | | |
|---|---|---|---|
| CN | 212848360 | U | 3/2021 |
| CN | 112071583 | B | 11/2021 |
| CN | 116157923 | A | 5/2023 |
| TW | 200504993 | A | 2/2005 |
| TW | 200711123 | A | 3/2007 |
| TW | 200901409 | A | 1/2009 |
| TW | 202322337 | A | 6/2023 |

* cited by examiner

INSULATION STRUCTURE AND ELECTRONIC DEVICE

CROSS-REFERENCE TO RELATED APPLICATIONS

This application claims priority to Chinese Patent Application No. 202310982995.5, filed on Aug. 4, 2023 and entitled "INSULATION STRUCTURE AND ELECTRONIC DEVICE", which is hereby incorporated by reference in its entirety.

TECHNICAL FIELD

The present application relates to the field of electrical equipment technology and, in particular, to an insulation structure and an electronic device.

BACKGROUND

In recent years, with the increasing progress of electronic industry technology, various electronic devices have developed rapidly towards small size, lightweight, modular, and high-voltage directions. With the rapid development of electronic devices, there are also various problems. For example, in an energy storage system with a voltage level of 1500V and higher, the reliability of a medium voltage auxiliary power supply gradually decreases as a voltage level increases. The reason for the above problem is that an insulation structure of some electronic devices in the medium voltage auxiliary power supply is prone to partial discharge and accelerated aging. Specifically, the insulation structure in related arts generally includes a substrate and a conductive body disposed on the substrate, but the inventor discovered that an edge tip of the conductive body near the substrate is prone to severe electric field distortion, leading to partial discharge or even insulation breakdown, accelerating the aging of the insulation structure, and seriously affecting the service life of the insulation structure.

SUMMARY

In order to overcome the aforementioned defects in the related arts, the purpose of the present application is to provide an insulation structure and an electronic device. The present application can improve the problem of electric field distortion at the end of the insulation structure, reduce the probability of partial discharge, delay the insulation aging process, and is conducive to improving the service life of the insulation structure.

In a first aspect, the present application provides an insulation structure, including:

- a first substrate, where the first substrate includes a first surface and a second surface oppositely disposed;
- a first conductive body, where the first conductive body is disposed on the first surface or the second surface;
- a first groove, where the first groove is located on a same surface as the first conductive body and adjacent to the first conductive body;
- where a surface of the first groove is provided with a first conductive layer, and the first conductive layer is electrically connected with the first conductive body.

In another aspect, the present application provides an electronic device including an insulation structure, the insulation structure includes:

- a first substrate, where the first substrate includes a first surface and a second surface oppositely disposed;

- a first conductive body, where the first conductive body is disposed on the first surface or the second surface;
- a first groove, where the first groove is located on a same surface as the first conductive body and adjacent to the first conductive body;
- where a surface of the first groove is provided with a first conductive layer, and the first conductive layer is electrically connected with the first conductive body.

The present application provides an insulation structure and an electronic device, where the insulation structure includes a first substrate, a first conductive body, and a first groove, the first substrate includes a first surface and a second surface oppositely disposed; the first conductive body is disposed on the first surface or second surface; the first groove is located on a same surface as the first conductive body and adjacent to the first conductive body; a surface of the first groove is provided with a first conductive layer, and the first conductive layer is electrically connected with the first conductive body. The insulation structure of the present application utilizes the first conductive layer electrically connected with the first conductive body to transfer the "three-phase point" where an electric field strength is concentrated in an intersection area of the first conductive body, the first substrate, and the insulation medium to the end of the first groove away from the first conductive body; at the same time, an equivalent thickness of the end of the first conductive body is increased, which slows down the trend of potential line changes at the end of the first conductive body, reduces the electric field strength here, improves the electric field distortion problem of the end of the first conductive body of the insulation structure, and improves the reliability of insulation. From the above description, the present application can improve the problem of electric field distortion at the end of the insulation structure, reduce the probability of partial discharge, delay the insulation aging process, and is conducive to improving the service life of the insulation structure.

BRIEF DESCRIPTION OF DRAWINGS

In order to more clearly describe the technical solution in embodiments of the present application or the related art, the following will briefly introduce the drawings that need to be used in the description of the embodiments or the related art. Apparently, the drawings in the following description are a part of embodiments of the present application. For the persons of ordinary skill in the art, other drawings can be obtained based on these drawings without creative labor.

REFERENCE NUMERALS

10—substrate; 20—conductive body; 30—round conductor; 40—strip conductor;
100—first substrate; 101—first surface; 102—second surface; 110—first groove;
111—side wall; 112—bottom wall; 113—arc transition segment; 120—second groove;
200—first conductive body;
300—first conductive layer;
400—first connecting layer;
500—second conductive body;
600—second conductive layer;
700—second substrate; 701—third surface; 702—fourth surface;
810—wire; 820—conductive protrusion; 830—conductive shielding cover;
831—main body; 832—bending part;
1000—heat sink; 2000—power device;
X—first direction; Y—second direction.

DETAILED DESCRIPTION OF EMBODIMENTS

Firstly, it should be noted that in the description of embodiments, a first direction X and a second direction Y are two mutually perpendicular directions in a plane. Among them, the first direction X may be a vertical direction for example, and the second direction Y may be a horizontal direction for example.

Figure 1:
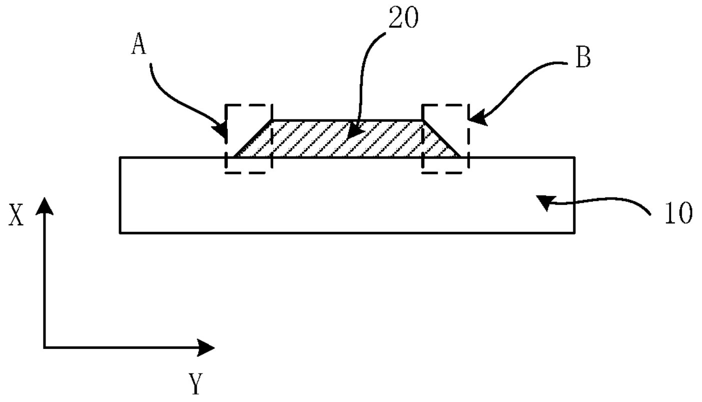
FIG. 1 is a structural diagram of an insulation structure in the related art.

FIG. 1 is a schematic diagram of an insulation structure in the related art. Please refer to FIG. 1, the insulation structure in the related art includes a substrate 10 and a conductive body 20 disposed on the substrate 10. In a plane parallel to a first direction X and a second direction Y, a projection shape of the conductive body 20 is generally trapezoidal. Due to a relatively thin thickness (usually only a few tens of microns thick) at edge tips of the conductive body 20 near a side of the first substrate (A and B in FIG. 1), the change of equipotential line is relatively quickly and an electric field strength is relatively concentrated; at the same time, this is also a “three-phase point” area where the three materials of “conductive body-substrate-insulation medium” intersect, further exacerbating a local electric field distortion in this area, which is prone to partial discharge and even leading to insulation breakdown, accelerating the aging of the insulation structure, and seriously affecting the service life of the insulation structure.

In order to alleviate the above problems, the related arts have also provided several improved insulation structures.

Figure 2:
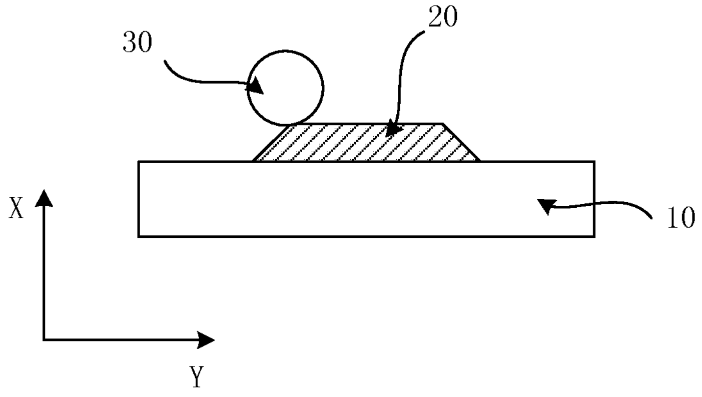
FIG. 2 is a structural diagram of another insulation structure in the related art.

FIG. 2 is a structural diagram of another insulation structure in the related art. As shown in FIG. 2, the insulation structure is welded with a round conductor 30 on the basis of the insulation structure shown in FIG. 1. Specifically, the round conductor 30 is welded to a surface of the conductive body 20 on the side away from the substrate 10. This insulation structure may alleviate the phenomenon of electric field distortion at the edge tip of the conductive body 20 at some extent. However, it requires high welding accuracy for the round conductor 30, and improper welding position of the round conductor 30 may affect the electric field control effect at the edge tip of the conductive body 20. In addition, this scheme also increases the volume of the insulation structure.

Figure 3:
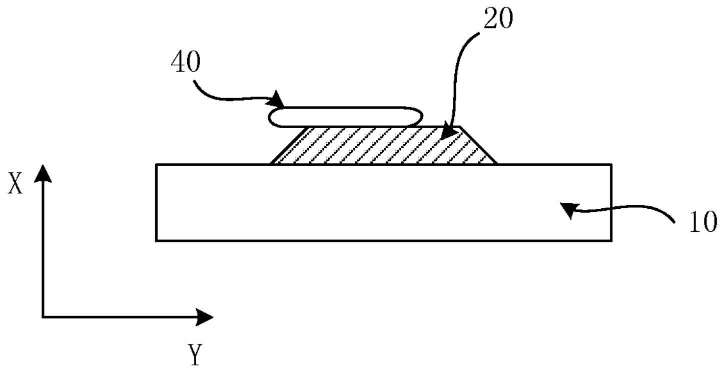
FIG. 3 is a structural diagram of yet another insulation structure in the related art.

FIG. 3 is a structural diagram of yet another insulation structure in the related art. As shown in FIG. 3, the insulation structure introduces a strip conductor 40 on the basis of the insulation structure shown in FIG. 1. Specifically, the strip conductor 40 is welded to a surface of the conductive body 20 on the side away from the substrate 10. This insulation structure may also alleviate the phenomenon of electric field distortion at the edge tip of the conductive body 20 at some extent. However, after the introduction of the strip conductor 40, a new tip will be formed at the end of the strip conductor 40, which will also cause the electric field distortion and affect the service life of the insulation structure. In order to improve the electric field at the edge tip of the conductive body 20, it is required that the thickness of the strip conductor 40 is thick enough, which will increase the volume of the insulation structure.

Figure 4:
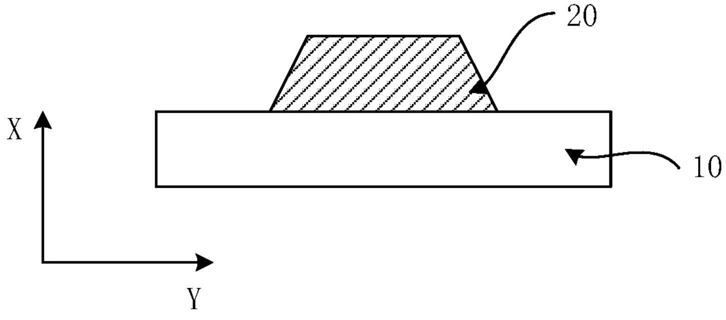
FIG. 4 is a structural diagram of yet another insulation structure in the related art.

FIG. 4 is a structural diagram of yet another insulation structure in the related art. As shown in FIG. 4, a thickness of the conductive body 20 of the insulation structure has been directly increased on the basis of the insulation structure shown in FIG. 1. The insulation structure has a poor effect on improving the electric field distortion at the edge tip of the conductive body 20 (such as increasing the thickness of the conductive body 20 from 1 oz to 6 oz, but only reducing the electric field at the end by 13%). At the same time, the process is relatively complex and the implementation cost is high in a specific implementation.

In view of this, some embodiments of the present application aim to provide an insulation structure and an electronic device, by setting a groove and a conductive layer on an inner surface of the groove, an end of the conductive body is electrically connected with the conductive layer, thereby transferring a “three-phase point” where an electric field strength is concentrated in an intersection area of the three materials of “conductive body-substrate-insulation medium” to one end of the conductive layer away from the conductive body; at the same time, it also increases an equivalent thickness of the end of the conductive body, and the change of the equipotential line is relatively smooth, thereby reducing the electric field strength here, improving the electric field distortion problem of the end of the conductive body of the insulation structure, and improving the reliability of insulation. In addition, the insulation structure of some embodiments will not result in an increase in volume.

In order to make the purpose, technical solution, and advantage of the embodiments of the present application clearer, the following will provide a clear and complete description of the technical solution in the embodiments of the present application in conjunction with the figures. Apparently, the described description are some embodiments of the present application rather than all embodiments of the present application.

On the basis of the embodiments in the present application, all other embodiments obtained by the persons of ordinary skill in the art without creative labor fall within the scope of protection in the present application. Without conflict, the following embodiments and the features in the embodiments may be combined with each other.

Figure 5:
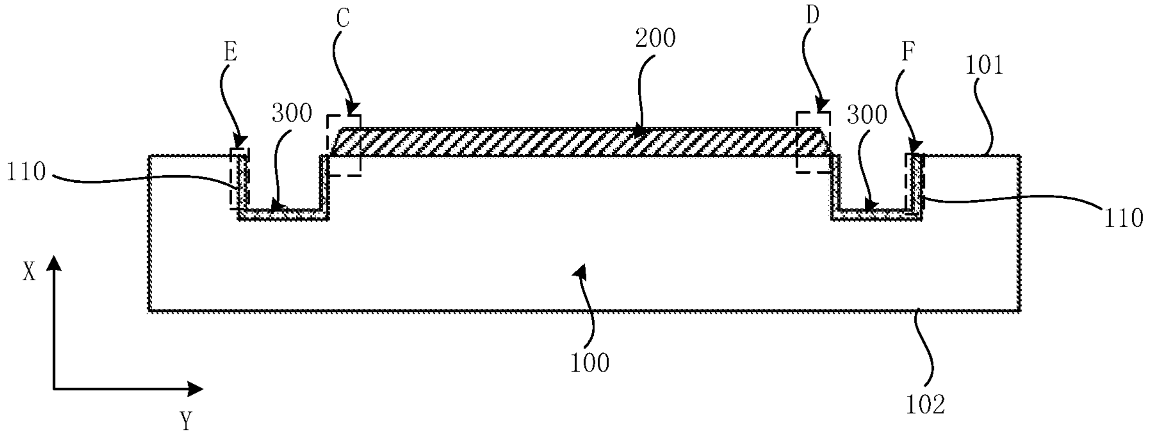
FIG. 5 is a structural diagram of an insulation structure provided in some embodiments of the present application.

FIG. 5 is a structural diagram of an insulation structure provided in some embodiments of the present application.

Please refer to FIG. 5, it provides an insulation structure, including:

- a first substrate 100, where the first substrate 100 includes a first surface 101 and a second surface 102 oppositely disposed;
- at least one first conductive body 200, where the first conductive body 200 is disposed on the first surface 101 or the second surface 102; it means that the first conductive body 200 can only disposed on one of the first surface 101 and the second surface 102, and the first conductive body 200 can also disposed on the first surface 101 and the second surface 102 at the same time;
- at least one first groove 110, where the first groove 110 is located on a same surface as the at least one first conductive body 200 and adjacent to the first conductive body 200;
- where the surface of the first groove 110 is provided with a first conductive layer 300, and the first conductive layer 300 is electrically connected with the first conductive body 200. In some embodiments, the first conductive layer 300 is a metal layer or a semi-conductive layer.

In some embodiments, the first substrate 100 is a solid-state insulation board, which may be a printed circuit board or a ceramic board. The first substrate 100 includes the first surface 101 and the second surface 102 oppositely disposed along a first direction X, and the first conductive body 200 and the first groove 110 may both be disposed on the first surface 101; where the first groove 110 may be disposed on both sides of the first conductive body 200 along the second direction Y. The first conductive layer 300 may be formed in the first groove 110 by a deposition manner; and the first conductive layer 300 may be a metal layer or a semi-conductive layer. In some embodiments, the first conductive body 200 may be a copper foil with a thickness less than 1 mm, such as, copper foils of 35 μm, 70 μm, and other thicknesses used in typical printed circuit boards. The end of the first conductive layer 300 is electrically connected with the first conductive body 200. Specifically, the first conductive layer 300 may be directly connected with the first conductive body 200 or indirectly connected through an intermediate medium, such as welding.

In some embodiments, first grooves 110 are disposed at both ends of the first conductive body 200, and the end of the first conductive body 200 is electrically connected with the first conductive layer 300 within the first groove 110, thereby transferring the "three-phase point" (at C and D in FIG. 5) where an electric field strength is concentrated in an intersection area of the first conductive body 200, the first substrate 100, and the insulation medium to the end of the first groove 110 away from the first conductive body 200 (at E and F in FIG. 5). At the same time, an equivalent thickness of the end of the first conductive body 200 is increased, which slows down the trend of potential line changes at the end of the first conductive layer 300, reduces the electric field strength here, improves the electric field distortion problem at the end of the first conductive body 200 of the insulation structure, and improves the reliability of insulation.

From the above description, the insulation structure in FIG. 5 can improve the problem of electric field distortion at the end of the insulation structure, reduce the probability of partial discharge, delay the insulation aging process, and is conducive to improving the service life of the insulation structure. Moreover, the above scheme will not increase the volume of the insulation structure.

In the structure shown in FIG. 5, a position of the first groove 110 is exactly coincided with the first conductive body 200, hence the first conductive layer 300 within the first groove 110 may be directly connected with the first conductive body 200. This structure requires high process accuracy.

In some other embodiments, the first groove 110 is separated from the first conductive body 200 by a preset distance. That is to say, the first groove 110 is not directly connected with the first conductive body 200, and at this time, the first conductive layer 300 is electrically connected with the first conductive body 200 through an intermediate medium. This structure can ensure good end electric field improvement while reducing process difficulty and avoiding damage to the first conductive body 200 during the machining process of the first groove 110.

Figure 6:
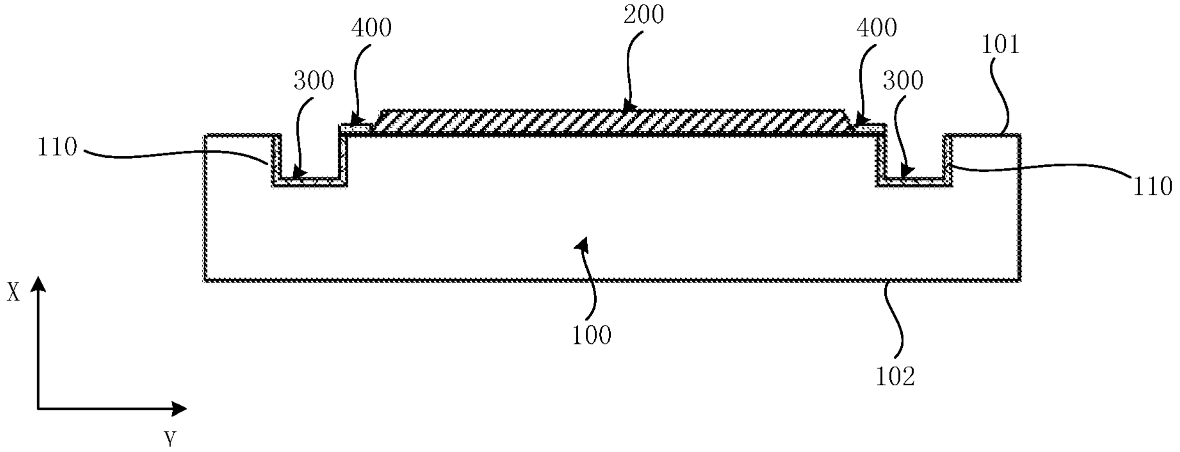
FIG. 6 is a structural diagram of an insulation structure provided in some embodiments of the present application.

FIG. 6 is a structural diagram of an insulation structure provided in some embodiments of the present application. Please refer to FIG. 6, the first substrate 100 is further provided with a first connecting layer 400, and the first conductive body 200 is connected with the first conductive layer 300 through the first connecting layer 400.

In some embodiments, the first connecting layers 400 are disposed on both sides of the first conductive body 200 along the second direction Y, in order to connect with the first conductive layer 300 on both sides. The first connecting layer 400 may be connected with the first conductive body 200 and the first conductive layer 300 by welding, in order to achieve electrical connection between the first conductive body 200 and the first conductive layer 300. The first connecting layer 400 may be a conductive metal layer (such as, a copper layer or an aluminum layer) or a semi-conductive layer.

In some embodiments, the first connecting layer 400 may also be a part of the first conductive layer 300; that is to say, the first connecting layer 400 and the first conductive layer 300 are integrally formed. Among them, the first conductive layer 300 is electrically connected with the first conductive body 200 after extending beyond the first groove 110.

In some embodiments, the preset distance mentioned above may range from 0 mm to 0.3 mm; that is to say, a length of the first connecting layer 400 in the second direction Y ranges from 0 mm to 0.3 mm. This preset distance can not only reduce the machining difficulty of the first groove 110, protect the first conductive body 200 from accidental damage, but also ensure the improvement effect of the first groove 110 on the electric field at the edge tip of the first conductive body 200.

Figure 7:
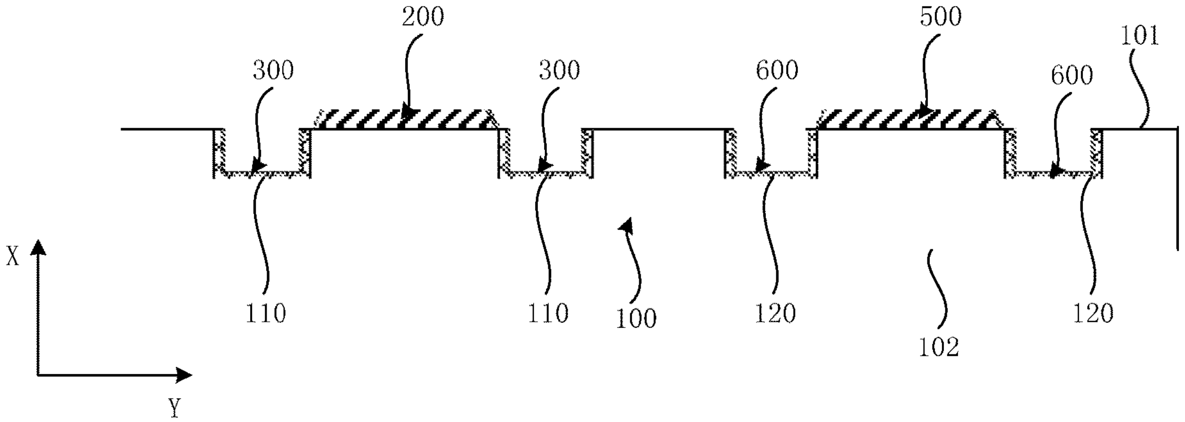
FIG. 7 is a structural diagram of an insulation structure provided in some embodiments of the present application.

FIG. 7 is a structural diagram of an insulation structure provided in some embodiments of the present application. Please refer to FIG. 7, the insulation structure further includes a second conductive body 500 and a second groove 120, where the first conductive body 200, the first groove 110, the second conductive body 500, and the second groove

120 are all located on a same surface, and the second groove 120 is adjacent to the second conductive body 500.

A surface of the second groove 120 is provided with a second conductive layer 600, and the second conductive layer 600 is electrically connected with the second conductive body 500. A potential of the first conductive body 200 is different from a potential of the second conductive body 500.

In some embodiments, the second conductive body 500 and the second conductive layer 600 may also be connected through a connecting layer (not shown in the figure), which may be a conductive metal layer (such as a copper layer or an aluminum layer) or a semi-conductive layer. In some embodiments, the connecting layer may also be a part of the second conductive layer 600; that is to say, the connecting layer and the second conductive layer 600 are integrally formed. Among them, the second conductive layer 600 and a second connecting layer may be a conductive metal layer (such as a copper layers, an aluminum layers, etc.) or a semi-conductive layer.

In some embodiments, the first conductive body 200, the first groove 110, the second conductive body 500, and the second groove 120 may all be disposed on the first surface 101; where the first groove 110 may be disposed on both sides of the first conductive body 200 along the second direction Y, and the second groove 120 may be disposed on both sides of the second conductive body 500 along the second direction Y. The first conductive layer 300 and the second conductive layer 600 may both be metal layers or semi-conductive layers. The first conductive layer 300 and the second conductive layer 600 may both be formed in corresponding grooves by a deposition manner. An end of the first conductive layer 300 is electrically connected with the first conductive body 200, and an end of the second conductive layer 600 is electrically connected with the second conductive body 500; which may be directly connected or indirectly connected through an intermediate medium; and the specific connection method may be welding, etc.

Due to the difference in potential between the first conductive body 200 and the second conductive body 500, the above structure can reduce the high electric field strength at the ends of the conductive bodies of the first conductive body 200 and the second conductive body 500.

Figure 8:
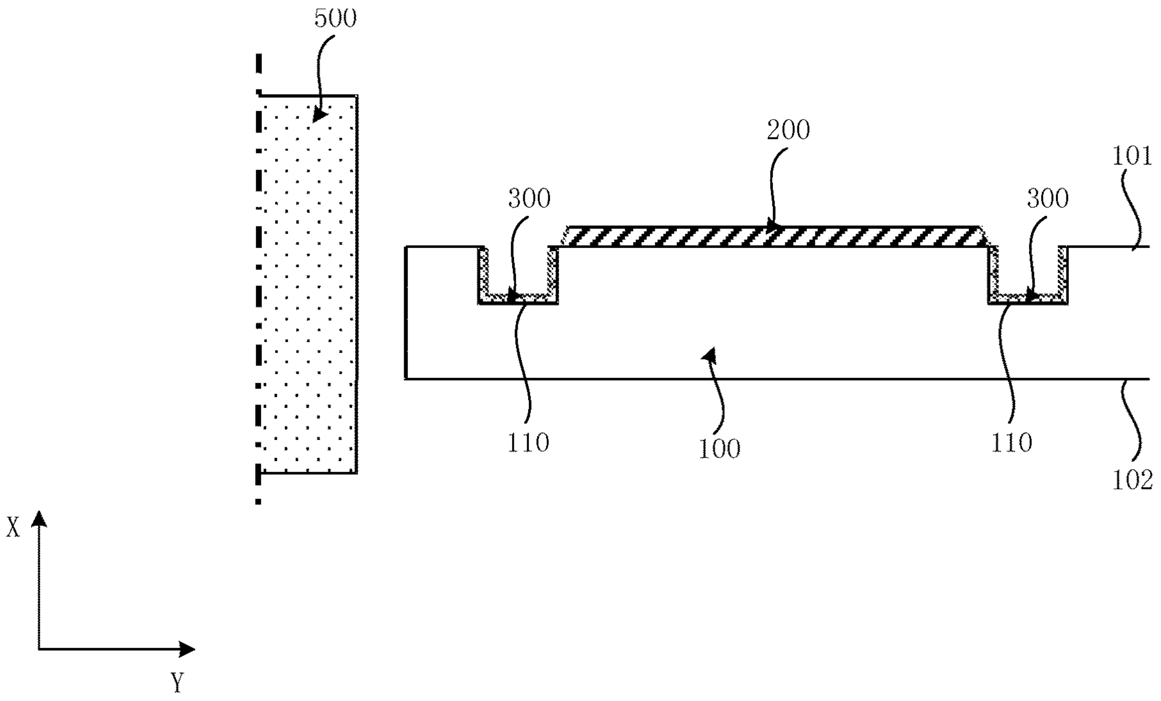
FIG. 8 is a structural diagram of an insulation structure provided in some embodiments of the present application.

FIG. 8 is a structural diagram of an insulation structure provided in some embodiments of the present application. Please refer to FIG. 8, the insulation structure further includes a second conductive body 500, where the second conductive body 500 is adjacent to the first substrate 100, and a potential of the first conductive body 200 is different from a potential of the second conductive body 500.

In some embodiments, the second conductive body 500 may be a magnetic core in a magnetic component, and a dashed line represents an axis of symmetry for the second conductive body 500. The second conductive body 500 is adjacent to the first substrate 100 along the second direction Y, that is to say, there is a gap between the second conductive body 500 and the first conductive body 200 disposed on the first substrate 100. Due to the difference in potential between the first conductive body 200 and the second conductive body 500, the first grooves 110 are disposed on both sides of the first conductive body 200 along the second direction Y, and the first conductive layer 300 is disposed within the first groove 110, which can reduce the high electric field strength of the end of the first conductive body 200 towards the second conductive body 500.

Figure 9:
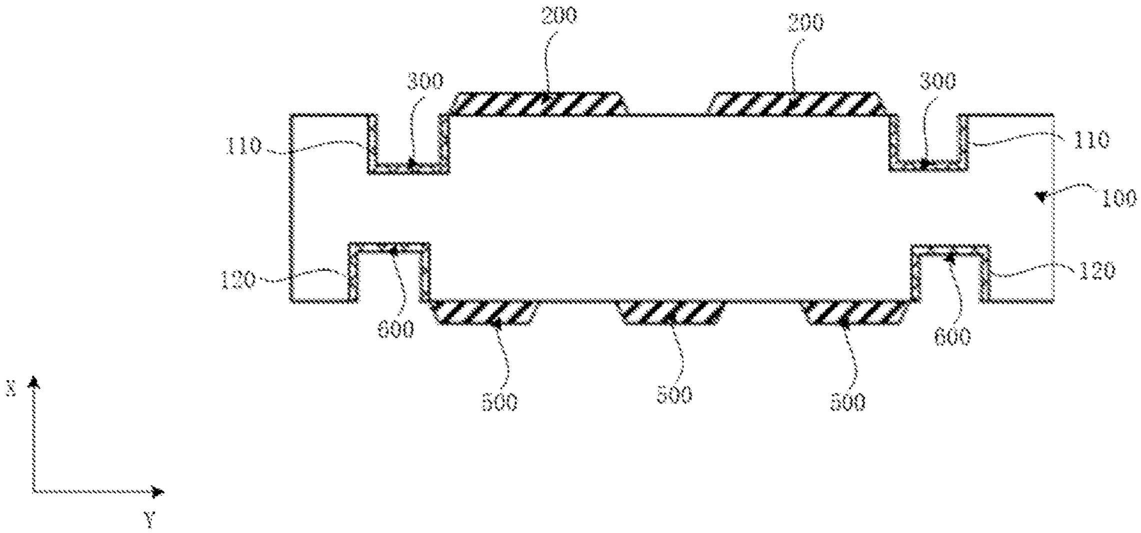
FIG. 9 is a structural diagram of an insulation structure provided in some embodiments of the present application.

FIG. 9 is a structural diagram of an insulation structure provided in some embodiments of the present application. Please refer to FIG. 9, the insulation structure further includes a second conductive body 500 and a second groove 120, where the first conductive body 200 and the first groove 110 are disposed on the first surface 101, the second conductive body 500 and the second groove 120 are disposed on the second surface 102, and the second groove 120 is adjacent to the second conductive body 500.

A surface of the second groove 120 is provided with a second conductive layer 600, the second conductive layer 600 is electrically connected with the second conductive body 500; and a potential of the first conductive body 200 is different from a potential of the second conductive body 500.

In some embodiments, there are multiple electrically connected first conductive bodies 200 and multiple electrically connected second conductive bodies 500 disposed on the first surface 101 and second surface 102 of the first substrate 100, respectively. Specifically, the first conductive bodies 200 and the first grooves 110 may be disposed on the first surface 101; and the first grooves 110 are located on the outer side of the outermost first conductive body 200 in the second direction Y. The second conductive bodies 500 and the second grooves 120 can both be arranged on the second surface 102, and in the second direction Y, the second grooves 120 are located on an outer side of the outermost second conductive body 500. The arrangement of the first conductive layers 300 and the second conductive layers 600 within their respective grooves are the same as described in the above embodiments, which will not be repeated here.

In some embodiments, there may be multiple first conductive bodies 200 and multiple second conductive bodies 500. When the multiple first conductive bodies 200 are connected in parallel, due to the same potential between the multiple first conductive bodies 200, the first grooves 110 may only be adjacent to an outer side of the outermost first conductive body 200. When the multiple second conductive bodies 500 are connected in parallel, the second grooves 120 may only be adjacent to an outer side of the outermost second conductive body 500. In other embodiments of the present application, when the multiple first conductive bodies 200 are connected in series, first grooves 110 may be disposed on both sides of each first conductive body 200 along the second direction Y, or when the multiple second conductive bodies 500 are connected in series, second grooves 120 may be disposed on both sides of each second conductive body 500.

In some embodiments, due to the difference in potential between the first conductive body 200 and the second conductive body 500, the first groove 110 is disposed on the outer side of the first conductive body 200 and the first conductive layer 300 is disposed within the first groove 110, which may reduce the high electric field strength at the end of the first conductive body 200; and the second groove 120 is disposed on the outer side of the second conductive body 500 and the second conductive layer 600 is disposed within the second groove 120, which may reduce the high electric field strength at the end of the second conductive body 500.

Figure 10:
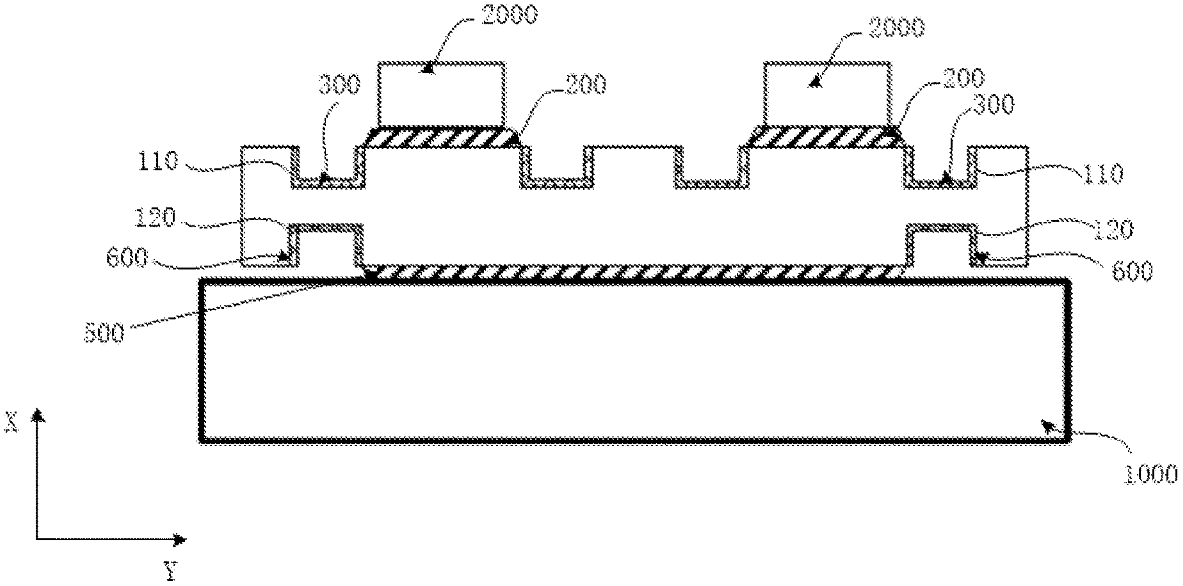
FIG. 10 is a structural diagram of an insulation structure provided in some embodiments of the present application.

FIG. 10 is a structural diagram of an insulation structure provided in some embodiments of the present application. Please refer to FIG. 10, the insulation structure further includes a heat sink 1000, and the heat sink 1000 is disposed on the second surface 102.

In some embodiments, the first surface 101 of the first substrate 100 is provided with multiple first conductive bodies 200, the multiple first conductive bodies 200 are spaced apart from each other along the second direction Y, and each first conductive body 200 may be connected with a power device 2000, specifically connected to a back plate or a PIN of the power device 2000. In some embodiments, potentials of the multiple first conductive bodies 200 may be different from each other, and each first conductive body 200 is provided with first grooves 110 on both sides. Each of the first groove 110 is provided with a first conductive layer 300 electrically connected to the corresponding first conductive body 200. The heat sink 1000 is disposed on the second surface 102 and electrically connected with the second conductive body 500. A potential of the first conductive body 200 located on the first surface 101 is different from a potential of the second conductive body 500 located on the second surface 102.

It can be understood that when a part of the first conductive bodies 200 in the multiple first conductive bodies 200 are connected in parallel, the potentials of the parallel connected part of the first conductive body 200 is the same with each other. At this time, the first groove 110 and the first conductive layer 300 only need to be disposed outside the outermost first conductive body 200 in the parallel connected part of the first conductive bodies 200.

In some embodiments, the first groove 110 is disposed on the outer side of the first conductive body 200, and the first conductive layer 300 is disposed within the first groove 110, which may reduce the high electric field strength of the end of the first conductive body 200 and the end of the second conductive body 500. Due to the different potentials of different first conductive bodies 200, the first grooves 110 are disposed on both sides of each first conductive body 200, and the first conductive layers 300 are disposed within the corresponding first grooves 110, which may reduce the high electric field strength at the ends of adjacent first conductive bodies 200; the second groove 120 is disposed on the outer side of the second conductive body 500 and a second conductive layer 600 is disposed within the second groove 120, which may reduce the high electric field strength at the end of the second conductive body 500.

Figure 11:
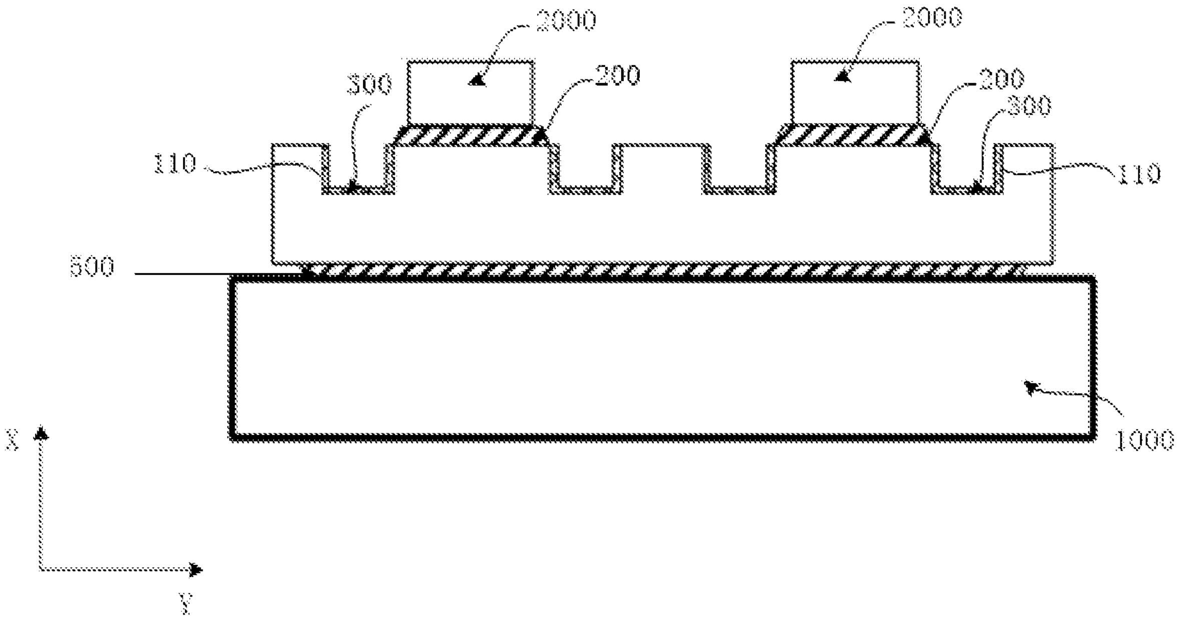
FIG. 11 is a structural diagram of an insulation structure provided in some embodiments of the present application.

FIG. 11 is a structural diagram of an insulation structure provided in some embodiments of the present application. Please refer to FIG. 11, a difference between the embodiments shown in FIG. 11 and FIG. 10 is that, the projection of the first conductive body 200 on the first surface 101 is inside of the projection of the second conductive body 500 or the heat sink 1000 on the first surface 101. At this time, in the first direction X, the end of first conductive body 200 and the end of second conductive body 500 are not directly opposite, so it is not necessary to dispose a metallized groove structure on both sides of the second conductive body 500.

Figure 12:
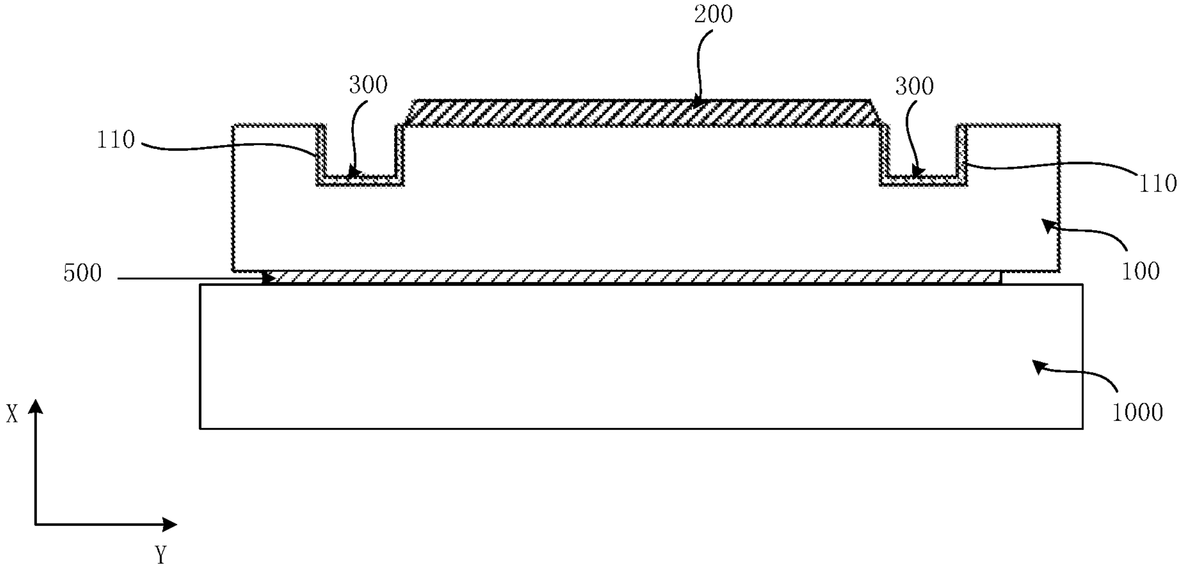
FIG. 12 is a structural diagram of an insulation structure provided in some embodiments of the present application.

FIG. 12 is a structural diagram of an insulation structure provided in some embodiments of the present application. Please refer to FIG. 12, which differs from the embodiments shown in FIG. 11 is that it only shows the case of including a single first conductive body 200.

Figure 13:
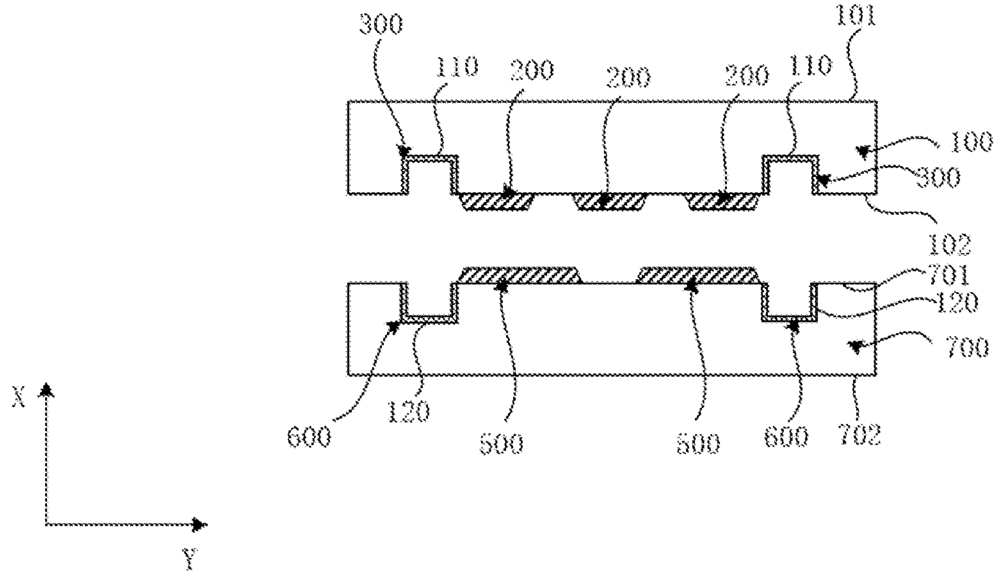
FIG. 13 is a structural diagram of an insulation structure provided in some embodiments of the present application.

FIG. 13 is a structural diagram of an insulation structure provided in some embodiments of the present application. Please refer to FIG. 13. In some embodiments, the insulation structure further includes:

a second substrate 700, where the second substrate 700 includes a third surface 701 and a fourth surface 702 oppositely disposed;

at least one second conductive body 500, where the second conductive body 500 is disposed on the third surface 701 or the fourth surface 702; it is means that the second conductive body 500 can only disposed on one of the third surface 701 and the fourth surface 702, and the second conductive body 500 can also disposed on both of the third surface 701 and the fourth surface 702 at the same time;

at least one second groove 120, where the second groove 120 is located on a same surface as the at least one second conductive body 500 and adjacent to the second conductive body 500;

where a potential of the first conductive body 200 is different from a potential of the second conductive body 500. A surface of the second groove 120 is provided with a second conductive layer 600, and the second conductive layer 600 is electrically connected with the second conductive body 500. Among them, the second conductive layer 600 may be example, a metal layer or a semi-conductive layer.

In some embodiments, there are two planar winding structures in a planar magnetic component. Both The first substrate 100 and the second substrate 700 can be solid-state insulation boards, which may be printed circuit boards or ceramic boards. The second surface 102 of the first substrate 100 may be provided with multiple first conductive bodies 200 connected in series to form a first winding, the first grooves 110 may be disposed on both sides of the outermost first conductive body 200 along the second direction Y, and the first groove 110 is provided with the first conductive layer 300 electrically connected to the first conductive body 200. The third surface 701 of the second substrate 700 may be provided with multiple second conductive bodies 500 connected in series to form a second winding, the second grooves 120 may be disposed on both sides of the outermost second conductive body 500 along the second direction Y, and the second groove 120 is provided with the second conductive layer 600 electrically connected to the second conductive body 500.

Through the above structure, it can reduce the high electric field strength at the end of the first conductive body 200 and the end of the second conductive body 500.

Furthermore, the second substrate 700 is further provided with a second connecting layer (not shown in the figure), and the second conductive body 500 is connected to the second conductive layer 600 through the second connecting layer.

In some embodiments, the second connecting layer is disposed on both sides of the second conductive body 500 along the second direction Y, to connect the second conductive layer 600 on both sides. The second connecting layer may be connected with the second conductive body 500 and the second conductive layer 600 by welding, to achieve the electrical connection between the second conductive body 500 and the second conductive layer 600. The second connecting layer may be a conductive metal layer (such as a copper layer or an aluminum layer) or a semi-conductive layer.

In some other embodiments, the second connecting layer is a part of the second conductive layer 600; that is to say, the second connecting layer and the second conductive layer 600 are integrally formed. Among them, the second conductive layer 600 is electrically connected with the second conductive body 500 after extending beyond the second groove 120.

Figure 14:
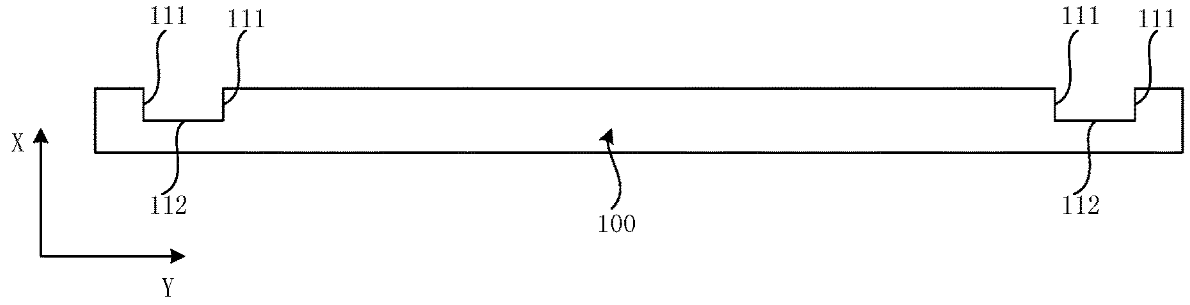
FIG. 14 is a structural diagram of a first substrate provided in some embodiments of the present application.

FIG. 14 is a structural diagram of a first substrate provided in some embodiments of the present application. Please continue to refer to FIG. 5 and FIG. 14, the first conductive body 200 and the first groove 110 are disposed on the first surface 101, and the first groove 110 includes two side walls 111 and a bottom wall 112.

In some embodiments, the first groove 110 includes two side walls 111 parallel to the first direction X and a bottom wall 112 parallel to the second direction Y. The side walls 111 are perpendicular to the bottom wall 112, and a projection of the first groove 110 in a plane parallel to a plane formed by the first direction X and the second direction Y is in the form of a square with an opening on one side.

The setting of the first groove 110 improves the electric field distortion problem at the edge tip of the first conductive body 200, however, the first conductive layer 300 at both ends of the side wall 111 of the first groove 110 is a new electric field concentration area (referring to the area E in FIG. 5). In order to further enhance the reliability of insulation of the product, it is necessary to improve and handle the electric field concentration problem of these two new ends.

Figure 15:
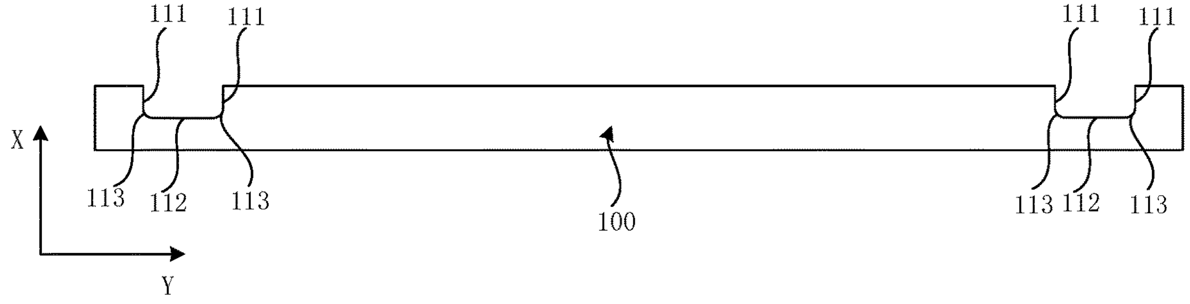
FIG. 15 is a structural diagram of a first substrate provided in some embodiments of the present application.

FIG. 15 is a structural diagram of a first substrate provided in some embodiments of the present application. Please refer to FIG. 15, the side wall 111 and bottom wall 112 are connected through an arc transition segment 113.

Compared to the embodiments shown in FIG. 14, the embodiments shown in FIG. 15 are beneficial for improving the electric field concentration problem of the first conductive layer 300 at the connection between the side walls 111 and the bottom wall 112, further reducing the probability of partial discharge and improving the reliability of the insulation structure.

Figure 16:
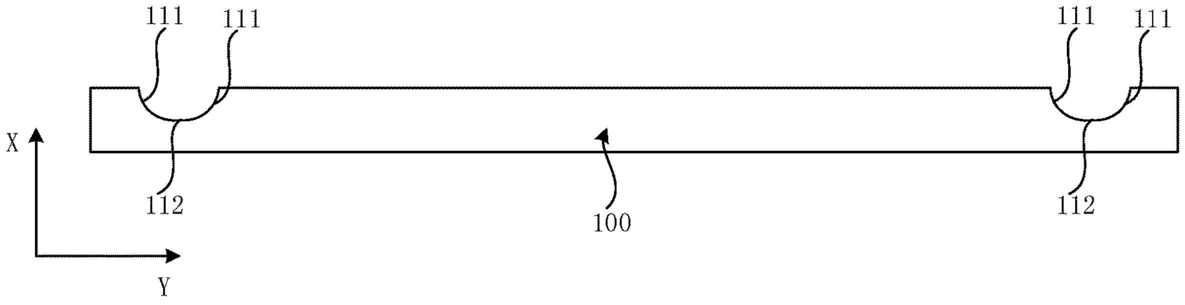
FIG. 16 is a structural diagram of a first substrate provided in some embodiments of the present application.

FIG. 16 is a structural diagram of a first substrate provided in some embodiments of the present application. Please refer to FIG. 16, in some embodiments, within a cross-section perpendicular to the first substrate 100, the bottom wall 112 and the side walls 111 on both sides of the bottom wall 112 jointly form an arc shape.

Compared to the embodiments shown in FIG. 15, the embodiments shown in FIG. 16 conducive to further improving the electric field concentration problem of the first conductive layer 300 at the connection between the side walls 111 and the bottom wall 112, making the electric field distribution at the end of the first conductive layer 300 more uniform, and further improving the reliability of the insulation structure.

In the above embodiments, the first conductive layer 300 located on the side wall 111 and the first conductive layer 300 located on the bottom wall 112 have the same thickness.

It should be noted that, the structure of the second groove 120 may also adopt any of the aforementioned structures of the first groove 110.

Figure 17:
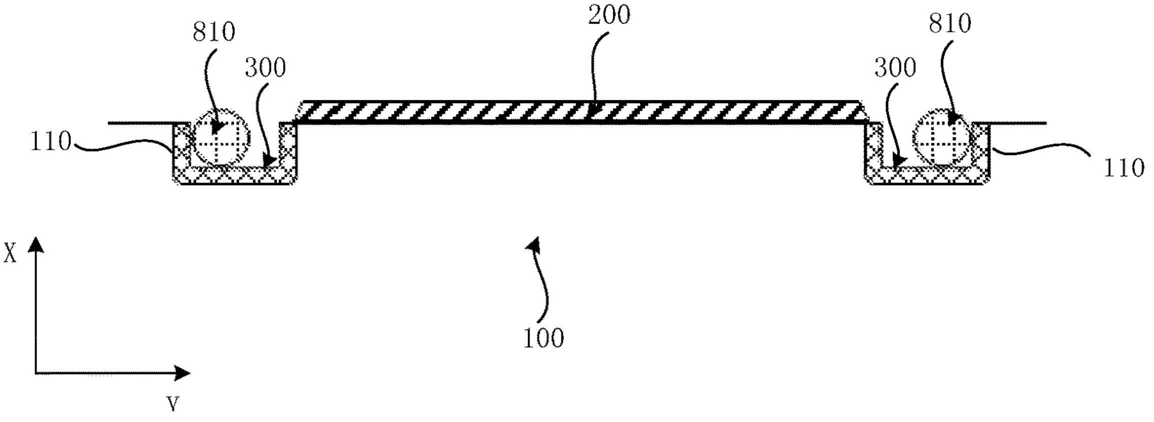
FIG. 17 is a structural diagram of an insulation structure provided in some embodiments of the present application.
Figure 18:
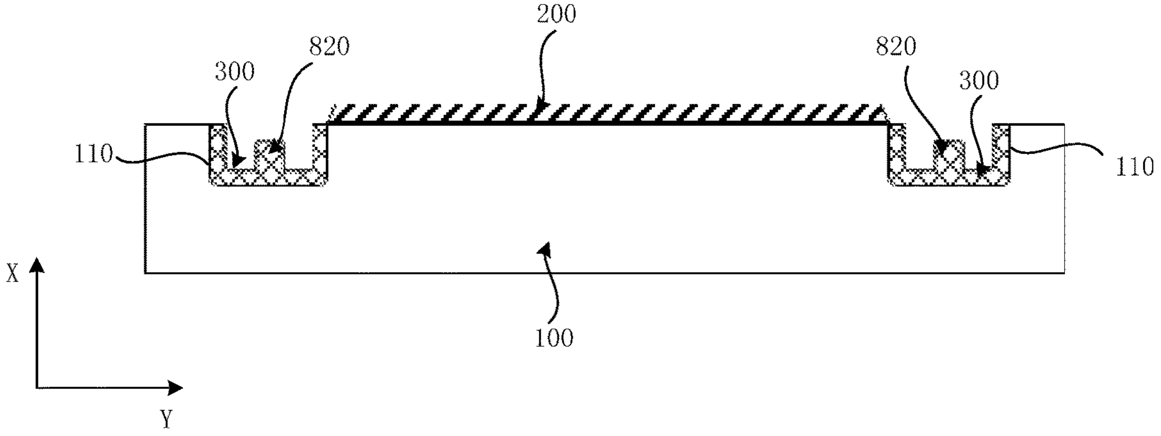
FIG. 18 is a structural diagram of an insulation structure provided in some embodiments of the present application.
Figure 19:
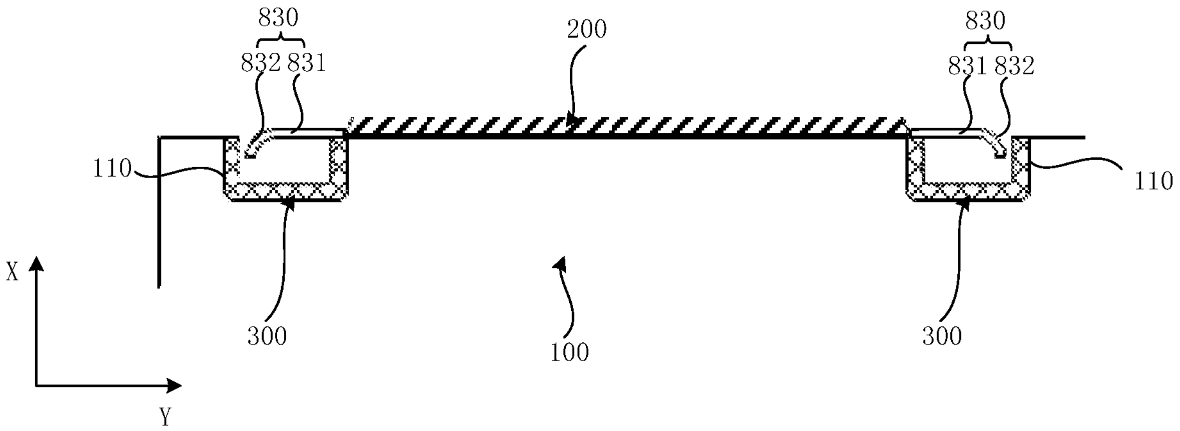
FIG. 19 is a structural diagram of an insulation structure provided in some embodiments of the present application.

FIG. 17 is a structural diagram of an insulation structure provided in some embodiments of the present application; FIG. 18 is a structural diagram of an insulation structure provided in some embodiments of the present application; and FIG. 19 is a structural diagram of an insulation structure provided in some embodiments of the present application. Please refer to FIG. 17-FIG. 19, a shielding structure is provided in the first groove 110 to improve electric field of the end of the first conductive layer 300 at the end of the side walls 111 of the first groove 110 away from the bottom wall 112.

In some embodiments, as shown in FIG. 17, the shielding structure is a wire 810, where the wire 810 is connected with the first conductive layer 300 at a side wall 111 away from the first conductive body 200.

In some embodiments, the wire 810 may be a copper wire, or an aluminum wire, and etc.; the wire 810 is disposed at one end away from the first conductive body 200 in the second direction Y and connected with the side wall 111 of the first groove 110. Furthermore, a side of wire 810 away from the bottom wall 112 is higher than the first surface 101 to achieve better electric field improvement effect.

Through the above structure, an equivalent width of the first conductive layer 300 on the side away from the first conductive body 200 can be increased, so that the change of equipotential line of the first conductive layer 300 at the end of the side wall 111 on the side away from the first conductive body 200 in the second direction Y is relatively smooth, thereby avoiding electric field strength concentration, reducing the probability of partial discharge, and delaying the insulation aging process, which is conducive to improving the service life of the insulation structure.

In some embodiments, as shown in FIG. 18, the shielding structure is a conductive protrusion 820, where the conductive protrusion 820 is located on the first conductive layer 300 on a surface of the bottom wall 112.

In some embodiments, the conductive protrusion 820 may be located in the middle of the bottom wall 112 in the second direction Y; and a material of the conductive protrusion 820 may be the same as a material of the first conductive layer 300. The conductive protrusion 820 may be formed on the first conductive layer 300 by a manner of deposition. Furthermore, the conductive protrusion 820 extends in a direction away from the bottom wall 112, and a side of the conductive protrusion 820 away from the bottom wall 112 is higher than the first surface 101, thereby providing a better high electric field strength shielding effect.

Through the above structure, it can optimize the electric field strength distribution within the first conductive layer 300, make the change of equipotential line of the first conductive layer 300 at the end of the side wall 111 away from the first conductive body 200 more smooth, avoiding electric field strength concentration, further reducing the probability of partial discharge, delaying the insulation aging process, and improving the service life of the insulation structure.

In some embodiments, as shown in FIG. 19, the shielding structure is a conductive shielding cover 830, where the conductive shielding cover 830 includes a main body 831 and a bending part 832. The main body 831 is disposed parallel to the first surface 101 and covers an opening of the first groove 110 partly. A first end of the main body 831 is electrically connected with the first conductive body 200 or the first conductive layer 300, and a second end of the main body 831 is connected with the bending part 832, where the bending part 832 is bent towards the first groove 110.

In some embodiments, the conductive shielding cover 830 may be made of a material, such as, copper and aluminum sheets that are bent; the main body 831 is disposed along the second direction Y and covers the opening of the first groove 110 partly, and the main body 831 electrically connects the bending part 832 with the first conductive body 200 or the first conductive layer 300.

Through the above structure, it can improve the electric field strength distribution within the first conductive layer 300, further smoothening the change of equipotential line of the first conductive layer 300 at the end of the side wall 111 away from the first conductive body 200, avoiding electric field strength concentration, further reducing the probability of partial discharge, delaying the insulation aging process, and is conducive to improving the service life of the insulation structure.

Furthermore, in some embodiments, the main body 831 is disposed higher than the first surface 101, thereby achieving better high electric field strength shielding effect.

In some embodiments, the insulation structure further includes an insulation medium, where the insulation medium wraps around the insulation structure.

In some embodiments, the insulation medium may be a gas material, such as, air and inert gases, which is suitable for a product with a lower voltage level and a lower requirement for insulation and safety regulation; may also be a solid material, such as, an encapsulating adhesive with better insulation performance, and a fully encapsulated structure can be constructed using encapsulating adhesive to block a creepage path, which is suitable for a product with a higher requirement for voltage level and power density.

In some embodiments, the insulation structure further provides an electronic device, including the insulation structure in any one of the above embodiments.

Specifically, the electronic device includes any one of transformer, inductor, PCB-based busbar, and power device packaging module.

Figure 20:
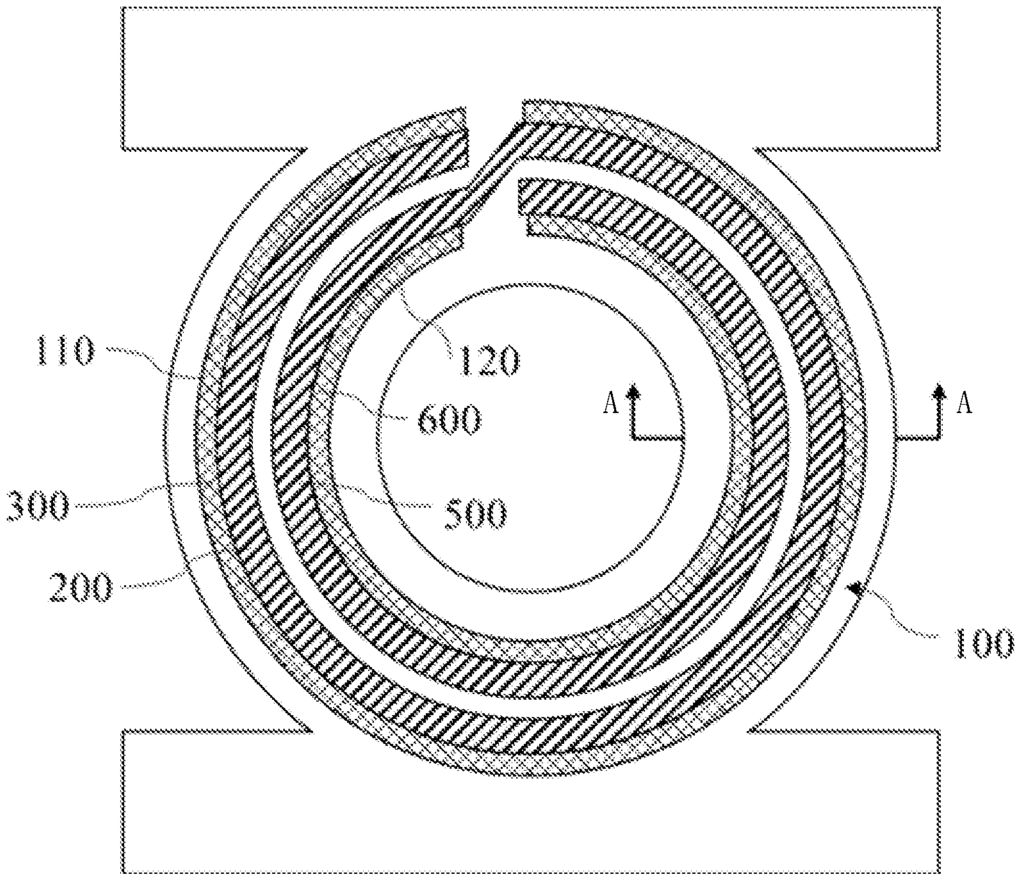
FIG. 20 is a structural diagram of an electronic device provided in some embodiments of the present application.

FIG. 20 is a structural diagram of an electronic device provided in some embodiments of the present application; where FIG. 7 shows a cross-sectional view of A-A section of FIG. 20. In some embodiments, when the insulation structure is applied to a magnetic component, the insulation structure may be a planar transformer, with the first conductor 200 being a spiral structure winding (such as a primary winding), with at least one turn. The second conductor 500 may be another winding (such as a secondary winding) in the magnetic component, and this insulation structure may be used to reduce the high electric field strength at the end of the two windings.

In some embodiments, the above magnetic component may include a magnetic core (as shown in FIG. 8) or do not include a magnetic core (as shown in FIG. 9 and FIG. 13). The electronic device may be a transformers or an inductor.

In some embodiments, as shown in FIG. 8, the second conductive body 500 may be a magnetic core, and the insulation structure may be used to reduce the high electric field strength of the end of the conductive layer of the winding to the magnetic core.

In some embodiments, the first conductive body 200 and the second conductive body 500 may be located on different insulation substrates (as shown in FIG. 13); may also be located on both surfaces of a same insulation substrate (as shown in FIG. 9); may also be located in different layers of a same insulation substrate.

In some embodiments, when the insulation structure is applied to a PCB-based busbar, the first conductive body 200 and the second conductive body 500 may be conductive bodies connected to different potential points in a circuit system, such as, the first conductive body 200 connected to a positive pole of the circuit system and the second conductive body 500 connected to a negative pole of the circuit system. In some embodiments, a number of conductive bodies with different potential located on each surface of the insulation substrate is not limited, nor is a number of conductive bodies with same potential located on each surface of the insulation substrate.

In some embodiments, as shown in FIG. 7, the first conductive body 200 and the second conductive body 500 may be located on a same surface of the insulation substrate. The insulation structure is more suitable for a situation where a potential difference between the first conductive body 200 and the second conductive body 500 is small, i.e. when the requirement for insulation is relatively low.

In some embodiments, the first conductive body 200 and the second conductive body 500 may also be located on opposite surfaces of the insulation substrate. The insulation structure is more suitable when a potential difference between the first conductive body 200 and the second conductive body 500 is relatively large, i.e. when the requirement for insulation is relatively high. The two conductive bodies are located on opposite surfaces, which can fully utilize the insulation capacity of the insulation substrate, and avoid the problem of excessive busbar size caused by high requirement for insulation safety distance when the first conductive body 200 and the second conductive body 500 are located on the same side.

In addition, the first conductive body 200 and the second conductive body 500 may also be located on different layers of the insulation substrate, such as, integrating more than two potentials in a PCB-based busbar.

In some embodiments, when the insulation structure is applied to a power device packaging module, the first conductive body 200 is used for installation of the power device, which is connected to a metal back plate or a pin of the power device. The second conductive body 500 may be connected to a heat sink 1000 on the other side of the insulation substrate. This insulation structure may be used to reduce the high electric field strength at the ends of the conductive bodies of the first conductive body 200 and the second conductive body 500 (as shown in FIG. 10). It should be noted that due to an unlimited number of devices that may be installed on an insulation substrate, which may be N (N≥1), correspondingly, a number of conductive bodies located on the same side of the insulation substrate is not less than N. When the N devices are connected in parallel (used to improve the current carrying capacity of the devices), their corresponding multiple conductive bodies have the same potential. At this time, the area between any two conductive bodies in the multiple conductive bodies may not set a metallized groove, and only a metallized grooves only needs to be disposed near the outer end of the outermost conductive body to improve the electric field distortion problem at the end of the outermost conductive body.

As shown in FIG. 10, when the N devices are connected in series, the insulation structure may further include multiple first conductive bodies 200 with different potentials disposed on the same side of the insulation substrate. At this time, both sides of each first conductive body 200 are provided with a first groove 110 and a first conductive layer 300. This insulation structure may be used to reduce the relative high electric field strength at the ends of the first conductive body 200 with different potentials.

As shown in FIG. 11 and FIG. 12, a projection of the first conductive body 200 on the first surface 101 may be located within the range of the projection of the second conductive body 500 or the heat sink 1000 on the first surface 101. At this time, in the first direction X, the end of the first conductive body 200 and the end of the second conductive body 500 are not directly opposite. At the same time, the existence of the heat sink results in a larger equivalent thickness of the end of the second conductive body 500, results in eliminating of the electric field distortion, so that there is no need to dispose a metallized groove structure on both sides of the second conductive body 500.

In the description of the present application, it should be understood that the terms "center", "longitudinal", "lateral", "length", "width", "thickness", "up", "bottom", "front", "back", "left", "right", "vertical", "horizontal", "top", "bottom", "inside", "outside", "clockwise", "counterclockwise", "axial", "radial", "circumferential" and the like which indicate orientation or positional relationship based on an orientation or positional relationship shown in the attached figures, and is merely for the convenience of describing and simplifying the present application, rather than indicating or implying that the device or component referred to must have a specific orientation, be constructed and operated in a specific orientation, and therefore cannot be understood as a limitation on the present application.

In the present application, unless otherwise specified and limited, the terms "installation", "connection", "connecting", "fixing" and other terms should be broadly understood, for example, it may be a fixed connection, a detachable connection, or integrated formed; it may be directly connected or indirectly connected through an intermediate medium, which may be an internal connection between two components an interaction relationship between two components. For the persons of ordinary skill in the art, the specific meanings of the above terms in the present application can be understood based on specific circumstances.

It should be noted that in the description of the present application, the terms "first" and "second" are only used to facilitate the description of different components, which cannot be understood as indicating or implying sequential relationships, relative importance, or implying a number of indicated technical features. Therefore, features limited to "first" and "second" can explicitly or implicitly include at least one of these features.

In the present application, each embodiment or implementation is described in a progressive manner, and each embodiment focuses on a difference from other embodiments. The same and similar parts between each embodiment can be referred to each other.

In the description of the present application, the reference terms "an embodiment", "some embodiments", "illustrative embodiments", "example", "specific example", or "some examples" refer to a specific feature, a structures, a material, or a characteristic described in combination with the embodiments or examples included in at least one embodiment or example of the present application. In the present application, the schematic expressions of the above terms may not necessarily refer to the same implementation or example. Moreover, the specific feature, the structure, the material, or the characteristic described can be combined in an appropriate manner in any one or more embodiments or examples. It should be noted that the "A or B" in some embodiments of the present application means three situations: "A", "B", "A and B".

Finally, it should be noted that the above embodiments are only used to illustrate the technical solution of the present application rather than limiting it; although the present application has been described in detail with reference to the aforementioned embodiments, the persons of ordinary skill in the art should understand that they can still modify the technical solutions recorded in the aforementioned embodiments, or equivalently replace some or all of the technical features; and these modifications or replacements do not separate the essence of the corresponding technical solutions from the scope of the technical solutions of the various embodiments of the present application.

What is claimed is:

1. An insulation structure, comprising:

a first substrate, wherein the first substrate comprises a first surface and a second surface oppositely disposed;

a first conductive body, wherein the first conductive body is disposed on the first surface;

a first groove disposed on the first surface of the first substrate, wherein an opening of the first groove is located on the first surface, a preset thickness is reserved between a bottom wall of the first groove and the second surface, and the first groove is adjacent to the first conductive body;

wherein a surface of the first groove is provided with a first conductive layer, and the first conductive layer is electrically connected with the first conductive body.

2. The insulation structure according to claim 1, wherein the first substrate is further provided with a first connecting layer, and the first conductive body is connected with the first conductive layer through the first connecting layer.

3. The insulation structure according to claim 2, wherein the first connecting layer is a part of the first conductive layer, wherein the first conductive layer is electrically connected with the first conductive body after extending beyond the first groove.

4. The insulation structure according to claim 1, wherein the insulation structure further comprises a second conductive body and a second groove, wherein the first conductive body, the first groove, the second conductive body, and the second groove are all located on a same surface, and the second groove is adjacent to the second conductive body;

a surface of the second groove is provided with a second conductive layer, and the second conductive layer is electrically connected with the second conductive body; and a potential of the first conductive body is different from a potential of the second conductive body.

5. The insulation structure according to claim 1, wherein the insulation structure further comprises a second conductive body, the second conductive body is adjacent to the first substrate, and a potential of the first conductive body is different from a potential of the second conductive body.

6. The insulation structure according to claim 1, wherein the insulation structure further comprises a second conductive body and a second groove, wherein the second conductive body and the second groove are disposed on the second surface, and the second groove is adjacent to the second conductive body;

a surface of the second groove is provided with a second conductive layer, the second conductive layer is electrically connected with the second conductive body; and a potential of the first conductive body is different from a potential of the second conductive body.

7. The insulation structure according to claim 6, wherein the insulation structure further comprises a heat sink, and the heat sink is disposed on the second surface.

8. The insulation structure according to claim 1, wherein the insulation structure further comprises a second conductive body and a heat sink, wherein the second conductive body is disposed on the second surface, and a potential of the first conductive body is different from a potential of the second conductive body; and the heat sink is disposed on the second surface, and a projection of the first conductive body on the first surface is within a projection range of the second conductive body or the heat sink on the first surface.

9. The insulation structure according to claim 1, wherein there are multiple first conductive bodies, and the multiple first conductive bodies are connected in series or parallel, wherein the first groove is adjacent to an outer side of an outermost first conductive body.

10. The insulation structure according to claim 1, wherein the insulation structure further comprises:

a second substrate, wherein the second substrate comprises a third surface and a fourth surface oppositely disposed;

a second conductive body, wherein the second conductive body is disposed on the third surface or the fourth surface;

a second groove, wherein the second groove is located on a same surface as the second conductive body and adjacent to the second conductive body;

wherein a potential of the first conductive body is different from a potential of the second conductive body; a surface of the second groove is provided with a second conductive layer, and the second conductive layer is electrically connected with the second conductive body.

11. The insulation structure according to claim 10, wherein the second substrate is further provided with a second connecting layer, and the second conductive body is connected to the second conductive layer through the second connecting layer.

12. The insulation structure according to claim 11, wherein the second connecting layer is a part of the second conductive layer, wherein the second conductive layer is electrically connected with the second conductive body after extending beyond the second groove.

13. The insulation structure according to claim 1, wherein the first groove further comprises a side wall.

14. The insulation structure according to claim 13, wherein the first conductive layer located on the side wall and the first conductive layer located on the bottom wall have a same thickness.

15. The insulation structure according to claim 13, wherein the side wall is perpendicular to the bottom wall; or, the side wall and the bottom wall are connected through an arc transition segment; or, the bottom wall and side walls on both sides of the bottom wall jointly form an arc shape within a cross-section perpendicular to the first substrate.

16. The insulation structure according to claim 13, wherein a shielding structure is provided in the first groove.

17. The insulation structure according to claim 16, wherein the shielding structure is a wire, wherein the wire is connected with the first conductive layer at a side wall away from the first conductive body, wherein a side of the wire away from the bottom wall is higher than the first surface; or, the shielding structure is a conductive protrusion, wherein the conductive protrusion is located on the first conductive layer on a surface of the bottom wall, wherein the conductive protrusion extends in a direction away from the bottom wall, and a side of the conductive protrusion away from the bottom wall is higher than the first surface; or, the shielding structure is a conductive shielding cover, wherein the conductive shielding cover comprises a main body and a bending part, with the main body being parallel to the first surface and covering the opening of the first groove partly, a first end of the main body being electrically connected with the first conductive body or the first conductive layer, a second end of the main body being connected with the bending part, and the bending part being bent towards the first groove, wherein the main body is disposed higher than the first surface.

18. The insulation structure according to claim 1, wherein the first groove is separated from the first conductive body by a preset distance, wherein the preset distance ranges from 0 mm to 0.3 mm.

19. The insulation structure according to claim 1, wherein the first conductive layer is a metal layer or a semi-conductive layer.

20. The insulation structure according to claim 1, wherein the first substrate is a solid-state insulation board, wherein the solid-state insulation board is a printed circuit board or a ceramic board.

21. The insulation structure according to claim 1, wherein the insulation structure further comprises an insulation medium, wherein the insulation medium wraps around the insulation structure.

22. An electronic device, comprising an insulation structure, wherein the insulation structure comprises:

a first substrate, wherein the first substrate comprises a first surface and a second surface oppositely disposed;

a first conductive body, wherein the first conductive body is disposed on the first surface;

a first groove disposed on the first surface of the first substrate, wherein an opening of the first groove is located on the first surface, a preset thickness is reserved between a bottom of the first groove and the second surface, and the first groove is adjacent to the first conductive body;

wherein a surface of the first groove is provided with a first conductive layer, and the first conductive layer is electrically connected with the first conductive body.

23. The electronic device according to claim 22, wherein the electronic device comprises any one of a transformer, an inductor, a PCB-based busbar, and a power device packaging module.

* * * * *